United States Patent
Raghavan et al.

(10) Patent No.: US 10,578,681 B2
(45) Date of Patent: Mar. 3, 2020

(54) SENSORS USING DIGITALLY ASSISTED 1/X ANALOG GAIN COMPENSATION

(71) Applicant: Infineon Technologies AG, Neubiberg (DE)

(72) Inventors: Leneesh Raghavan, Villach (AT); Mario Motz, Wernberg (AT)

(73) Assignee: Infineon Technologies AG (DE)

( * ) Notice: Subject to any disclaimer, the term of this patent is extended or adjusted under 35 U.S.C. 154(b) by 195 days.

(21) Appl. No.: 15/794,296

(22) Filed: Oct. 26, 2017

(65) Prior Publication Data

US 2019/0128972 A1 May 2, 2019

(51) Int. Cl.
*G01R 33/00* (2006.01)
*G01R 33/07* (2006.01)

(52) U.S. Cl.
CPC ......... *G01R 33/0041* (2013.01); *G01R 33/07* (2013.01)

(58) Field of Classification Search
CPC ............................ G01R 33/0041; G01R 33/07
USPC ........................................................ 324/251
See application file for complete search history.

(56) References Cited

U.S. PATENT DOCUMENTS

| 10,261,137 | B2 * | 4/2019 | Motz | G01R 33/0029 |
| 2009/0128131 | A1 * | 5/2009 | Kobayashi | G01D 3/022 |
| | | | | 324/120 |
| 2017/0102438 | A1 * | 4/2017 | Motz | G01R 33/0029 |

* cited by examiner

*Primary Examiner* — Reena Aurora
(74) *Attorney, Agent, or Firm* — Design IP (57) ABSTRACT

Magnetic field sensors and sensing methods are provided. A magnetic sensor includes at least one magnetic field sensor element configured to generate an analog input sensor signal in response to a magnetic field, an inverting amplifier configured to generate an analog output sensor signal having a gained value with respect to the analog input sensor signal, a programmable current divider disposed in a negative feedback path of the inverting amplifier such that the gained value is dependent on an effective feedback resistor value of the programmable current divider, and a digital controller configured to receive at least one measurement parameter, generate a codeword based on the at least one measurement parameter, and transmit the codeword to the programmable current divider for compensating the gained value. The effective feedback resistor value is adjusted based on the codeword received by the programmable current divider.

22 Claims, 4 Drawing Sheets

SENSORS USING DIGITALLY ASSISTED 1/X ANALOG GAIN COMPENSATION

FIELD

The present disclosure relates generally to a magnetic sensors, and, more particularly, magnetic sensors that use digitally assisted analog gain compensation.

BACKGROUND

One type of magnetic sensor is a Hall-effect sensor (Hall sensor). A Hall effect sensor is a transducer that varies its output voltage (Hall voltage) in response to a magnetic field. It is based on the Hall effect which makes use of the Lorentz force. The Lorentz force deflects moving charges in the presence of a magnetic field which is perpendicular to the current flow through the sensor or Hall plate. Thereby, a Hall plate, referred to as the sensor element, can be a thin piece of semiconductor or metal. The deflection causes a charge separation which causes a Hall electrical field. This electrical field acts on the charge in the opposite direction with regard to the Lorentz Force. Both forces balance each other and create a potential difference perpendicular to the direction of current flow. The potential difference can be measured as a Hall voltage and varies in a linear relationship with the magnetic field for small values. Hall effect sensors can be used, for example, for proximity switching, positioning, speed detection, and current sensing applications.

In Hall sensor readout circuits, the magnetic signal from the Hall sensor element is converted to an electrical signal (e.g., a Hall voltage) which is further amplified and calibrated before reaching an output of the sensor. The Hall voltage may vary over temperature. For example, a non-linear relationship between the Hall voltage and temperature may exist such that as temperature increases, the Hall voltage decreases. This non-linear sensitivity variation over temperature of the Hall should be compensated for accurate sensing measurements.

Typically, in Hall sensor readout circuits, a digital interface is used for low speed operations (e.g., up to 10 kHz). That is, the analog output of the Hall sensor element (e.g., the Hall voltage) is converted into a digital signal by an analog-to-digital converter (ADC). Thus, all the compensations are calculated and implemented in the digital domain and a digital stream of N-bits is output from the readout circuit. This technique does not perform well for high bandwidth operations (e.g., 10 kHz to 120 kHz).

Thus, a magnetic Hall sensor may be desired that is capable of performing at higher speeds, for example, at a bandwidth up to 120 kHz.

SUMMARY

Magnetic field sensors and sensing methods are provided.

One or more embodiments provide a magnetic sensor that includes at least one magnetic field sensor element configured to generate an analog input sensor signal in response to a magnetic field; an inverting amplifier configured to generate an analog output sensor signal having a gained value with respect to the analog input sensor signal; a programmable current divider disposed in a negative feedback path of the inverting amplifier such that the gained value is dependent on an effective feedback resistor value of the programmable current divider; and a digital controller configured to receive at least one measurement parameter, generate a codeword based on the at least one measurement parameter, and transmit the codeword to the programmable current divider for compensating the gained value. The effective feedback resistor value is adjusted based on the codeword received by the programmable current divider.

One or more embodiments further provide a method for gain compensation implemented in a magnetic sensor. The method includes generating an analog input sensor signal by at least one magnetic field sensor element in response to a magnetic field; generating an analog output sensor signal based on the analog input sensor signal, the analog output sensor signal having a gained value with respect to the analog input sensor signal; generating a codeword based on at least one digital measurement parameter; and adjusting an effective feedback resistor value of a negative feedback path of an inverting amplifier based on the codeword such that the gained value is adjusted to compensate for the at least one digital measurement parameter.

BRIEF DESCRIPTION OF THE DRAWINGS

Embodiments are described herein making reference to the appended drawings.

FIG. 4 illustrates a schematic diagram of an equivalent resistor ladder of the programmable current divider of FIG. 3 when all the bits are ON.

DETAILED DESCRIPTION

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

Embodiments relate to sensors and sensor systems, and to obtaining information about sensors and sensor systems. A sensor may refer to a component which converts a physical quantity to be measured to an electric signal, for example, a current signal or a voltage signal. The physical quantity may for example comprise a magnetic field, an electric field, a pressure, a force, a current or a voltage, but is not limited thereto.

A magnetic field sensor, for example, includes one or more magnetic field sensor elements that measure one or more characteristics of a magnetic field (e.g., an amount of magnetic field flux density, a field strength, a field angle, a field direction, a field orientation, etc.) corresponding to detecting and/or measuring the magnetic field pattern of an element that generates the magnetic field (e.g., a magnet, a current-carrying conductor (e.g., a wire), the Earth, or other magnetic field source). Each magnetic field sensor element is configured to generate an analog sensor signal in response to one or more magnetic fields.

For example, a sensor signal (e.g., a voltage signal) generated by each magnetic field sensor element may be proportional to the magnitude of the magnetic field that impinges upon that magnetic field sensor element. Further, it will be appreciated that the terms "sensor" and "sensing element" may be used interchangeably throughout this description, and the terms "sensor signal" and "measurement value" may be used interchangeably throughout this description.

A Hall effect sensor, for example, is a transducer that varies its output voltage (Hall voltage) in response to a magnetic field. It is based on the Hall effect which makes use of the Lorentz force. The Lorentz force deflects moving charges in the presence of a magnetic field which is perpendicular to the current flow through the sensor or Hall plate. Thereby, a Hall plate, referred to as the magnetic field sensor element, can be a thin piece of semiconductor or metal. The deflection causes a charge separation which causes a Hall electrical field. This electrical field acts on the charge in the opposite direction with regard to the Lorentz Force. Both forces balance each other and create a potential difference perpendicular to the direction of current flow. The potential difference can be measured as a Hall voltage and varies in a linear relationship with the magnetic field for small values. Hall effect sensors can be used, for example, for proximity switching, positioning, speed detection, and current sensing applications.

In some examples, Hall sensor elements may be implemented as a vertical Hall sensor elements. A vertical Hall sensor is a magnetic field sensor which is sensitive to a magnetic field component which extends parallel to their surface. This means they are sensitive to magnetic fields parallel, or in-plane, to the IC surface. The plane of sensitivity may be referred to herein as a "sensitivity-axis" or "sensing axis" and each sensing axis has a reference direction. For Hall sensor elements, voltage values output by the sensor elements change according to the magnetic field strength in the direction of the sensing axis.

In other examples, Hall sensor elements may be implemented as lateral Hall sensor elements. A lateral Hall sensor is sensitive to a magnetic field component perpendicular to their surface. This means they are sensitive to magnetic fields vertical, or out-of-plane, to the integrated circuit (IC) surface. The plane of sensitivity may be referred to herein as a "sensitivity-axis" or "sensing axis" and each sensing axis has a reference direction. For Hall sensor elements, voltage values output by the sensor elements change according to the magnetic field strength in the direction of the sensing axis.

According to one or more embodiments, a magnetic field sensor and a sensor circuit may be both accommodated (i.e., integrated) in the same chip package (e.g., a plastic encapsulated package, such as leaded package or leadless package, or a surface mounted device (SMD)-package). This chip package may also be referred to as sensor package. The sensor package may be combined with a back bias magnet to form a sensor module, sensor device, or the like.

The sensor circuit may be referred to as a signal processing circuit and/or a signal conditioning circuit that receives one or more signals (i.e., sensor signals) from one or more magnetic field sensor elements in the form of raw measurement data and derives, from the sensor signal, a measurement signal that represents the magnetic field. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a sensor output suitable for processing after conditioning.

Thus, the sensor circuit may include an analog-to-digital converter (ADC) that converts the analog signal from the one or more sensor elements to a digital signal. The sensor circuit may also include a digital signal processor (DSP) that performs some processing on the digital signal, to be discussed below. The sensor circuit may further include a digital-to-analog converter (DAC) that converts the processed digital signal back into an analog signal. Therefore, the sensor package includes a circuit which conditions and amplifies the small signal of the magnetic field sensor element via signal processing and/or conditioning.

A sensor device, as used herein, may refer to a device which includes a sensor and sensor circuit as described above. A sensor device may be integrated on a single semiconductor die (e.g., silicon die or chip), although, in other embodiments, a plurality of dies may be used for implementing a sensor device. Thus, the sensor and the sensor circuit are disposed on either the same semiconductor die or on multiple dies in the same package. For example, the sensor might be on one die and the sensor circuit on another die such that they are electrically connected to each other within the package. In this case, the dies may be comprised of the same or different semiconductor materials, such as GaAs and Si, or the sensor might be sputtered to a ceramic or glass platelet, which is not a semiconductor.

Figure 1:
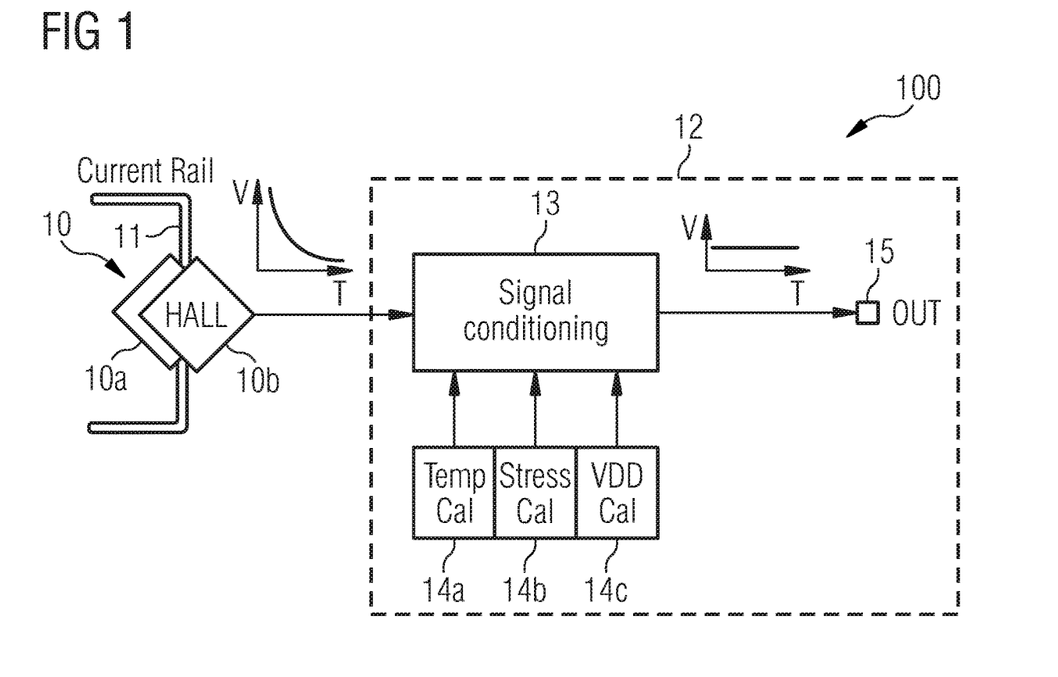
FIG. 1 shows a block diagram of a magnetic sensor according to one or more embodiments.

FIG. 1 shows a block diagram of a magnetic sensor 100 according to one or more embodiments. In particular, magnetic sensor 100 includes a differential Hall sensor pair 10, a current rail 11, and a readout circuit 12. The readout circuit 12 includes a signal conditioning circuit 13, a temperature (temp) calibration unit 14a, a stress calibration unit 14b, a supply voltage VDD calibration unit 14c, and an output pad 15.

The differential Hall sensor pair 10 includes two Hall sensor elements 10a, 10b differentially placed at different locations on a sensor die (not shown) and a current rail 11 causes a current to flow through the Hall sensor elements 10a, 10b. Each Hall sensor element 10a, 10b is configured to generate an analog sensor signal (e.g., a Hall voltage signal) in response to a magnetic field impinging thereon. For example, a Hall voltage is produced when the Hall sensor element 10a, 10b is in a presence of a magnetic field that is perpendicular to the current flow.

Together, the differential Hall sensor pair 10 generates an analog differential measurement signal (e.g., a differential Hall voltage). For example, the differential Hall sensor pair 10 may include combining circuitry or logic to generate the differential measurement signal. Thus, the combining circuitry may receive sensor signals from the Hall sensor elements 10a, 10b and may generate a differential measurement signal therefrom. For example, the combining circuitry of may include one or more differential amplifiers that outputs the difference between sensor elements 10a and 10b. Alternatively, the readout circuit 12 may contain the combining circuitry for receiving the raw measurement signals from the Hall sensor elements 10a, 10b, and the readout circuit 12 may generate the differential measurement signal before performing further signal processing.

It will be appreciated that, while the embodiments are described in the context of using a differential Hall sensor pair, the embodiments are not limited thereto. Thus, one or more Hall sensor elements may be used to generate a measurement signal to be further processed by the readout circuit 12. The differential analog interface provided by the differential Hall sensor pair may provide better performance for high bandwidth operations (e.g., up to 120 kHz) due to lower propagation delay along the continuous time analog signal path by the signal conditioning circuit 13.

As shown in FIG. 1, the differential measurement signal provided by the differential Hall sensor pair 10 has a non-linear dependence on temperature. Thus, as temperature increases, the differential Hall voltage decreases in a non-linear manner. Thus, the non-linear sensitivity variation over temperature of the differential Hall sensor pair 10 should be compensated at the analog interface.

The signal conditioning circuit 13 includes an analog signal path that receives the analog differential measurement signal, or receives and converts the individual analog measurement signals into the analog differential measurement signal, and outputs an analog output signal. In between the input and output of the signal conditioning circuit 13, the signal conditioning circuit 13 performs signal conditioning on the analog differential measurement signal in a continuous time domain, including signal conversion and amplification, and compensating (calibrating) for changes in temperature, stress, and supply voltage VDD in order to generate a sensitivity compensated analog output signal.

During the compensating, the signal conditioning circuit 13 may include an auxiliary path used to digitally assist the calibration of the analog measurement signal. For example, temperature, stress and VDD calibration may be implemented in digital discrete time domain via the auxiliary path to account for changes in temperature, stress, and supply voltage VDD by the signal conditioning circuit 13 before reaching the output pad 15. Thus, the differential measurement signal may be amplified with a high gain at the analog interface to provide good signal to noise ratio and dynamic range, while performing the calibration the differential measurement signal. The analog gain resolution should be high enough to provide good compensation over temperature, stress, supply voltage VDD, and process variation.

In order for the signal conditioning circuit 13 to compensate for temperature, mechanical stress, and supply voltage VDD, the signal conditioning circuit 13 receives input from the temp calibration unit 14a, the stress calibration unit 14b, the supply voltage VDD calibration unit 14c. The temp calibration unit 14a may include a temperature sensor configured to measure a temperature of the environment at the sensor die. Similarly, the stress calibration unit 14b may include a stress sensor configured to measure a stress (e.g., mechanical stress) applied to at least a portion of the sensor die (e.g., at the Hall sensor elements 10a, 10b). The supply voltage VDD calibration unit 14c may include a circuit component connected to the supply voltage VDD or a direct electrical connection to the supply voltage VDD for receiving the supply voltage VDD, which may fluctuate due to interference in a power supply that supplies power to the magnetic sensor 100.

Figure 2:
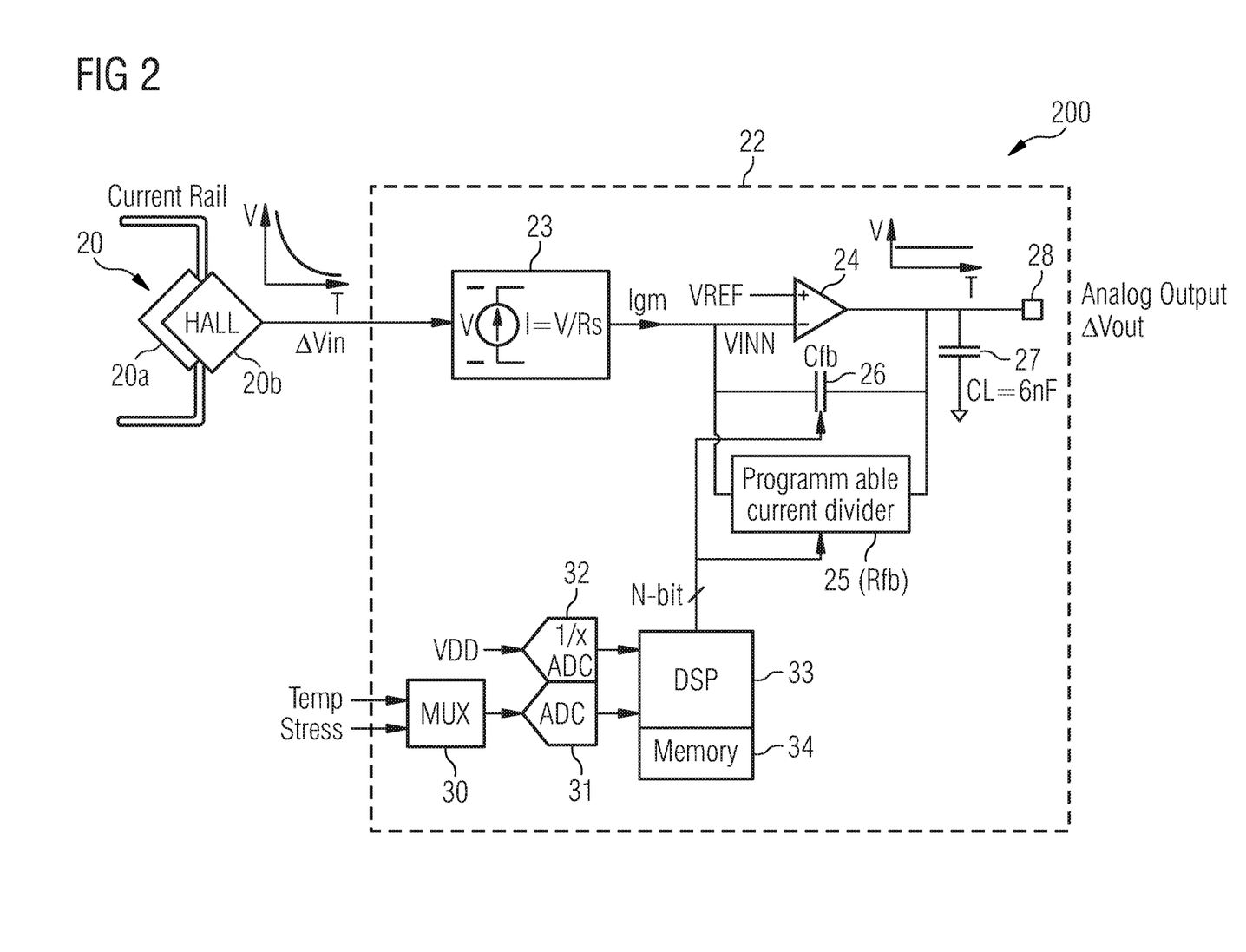
FIG. 2 shows a schematic block diagram of a magnetic sensor according to one or more embodiments.
Figure 3:
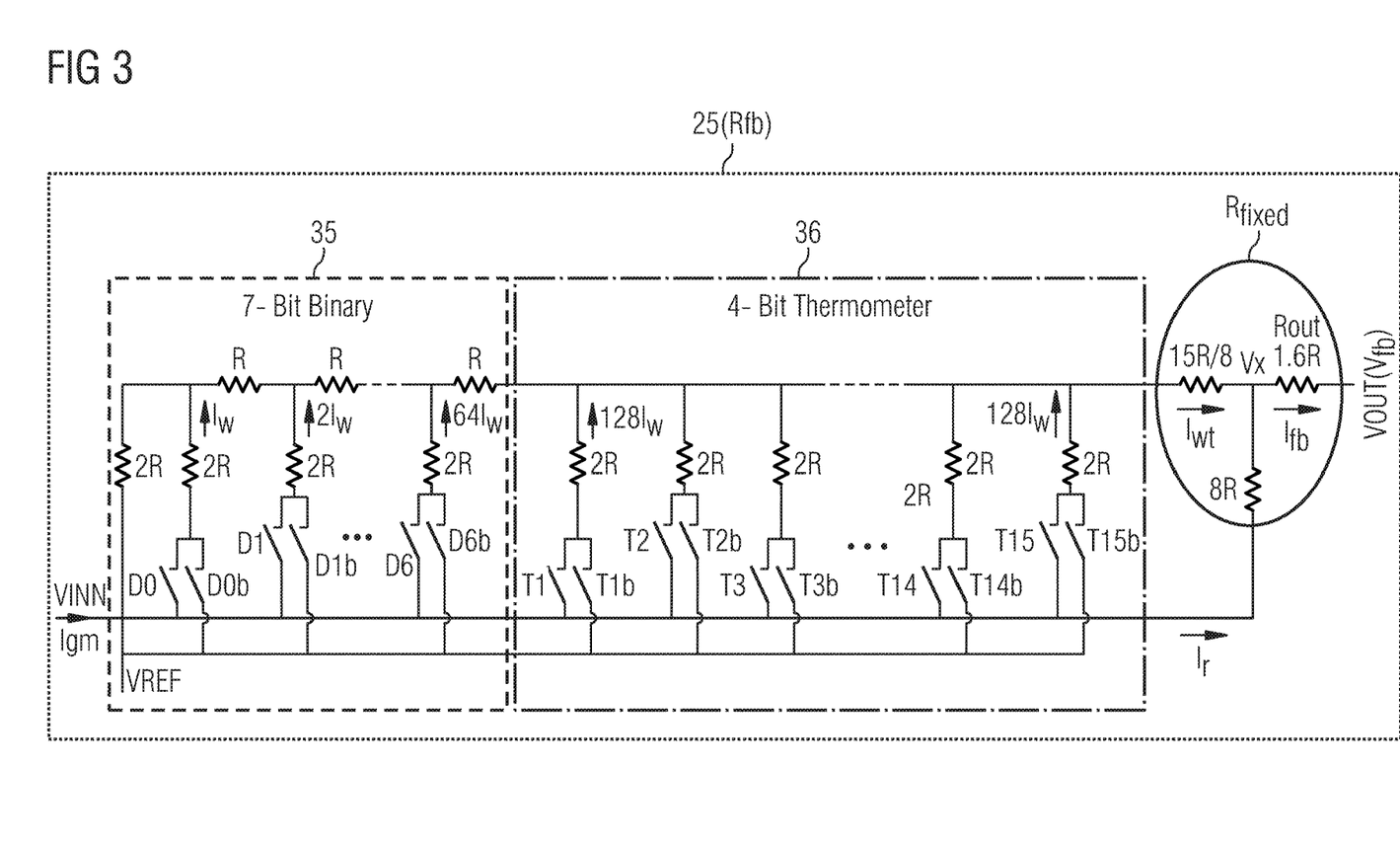
FIG. 3 illustrates a schematic diagram of a programmable current divider according to one or more embodiments.

Each of the temp calibration unit 14a, the stress calibration unit 14b, the supply voltage VDD calibration unit 14c may further include or be coupled to other circuitry that converts the measured parameters into a code (e.g., a DAC code) used for adjusting the analog gain of the differential measurement signal, the details of which will be further described in view of FIGS. 2 and 3. Thus, the sensitivity of the differential measurement signal can be compensated such that the dependence on temperature, mechanical stress is removed and interference in the power supply VDD is ratiometric.

The output pad 15 of the readout circuit 12 is configured to receive a continuous time domain (analog) output signal from the signal conditioning circuit 13 that has been compensated for temperature, mechanical stress, and supply voltage VDD. As can be seen at the output pad 15, the output signal is independent from temperature.

FIG. 2 shows a block diagram of a magnetic sensor 200 according to one or more embodiments. In particular, magnetic sensor 200 is similar to the magnetic sensor 100 of FIG. 1, but is provided in further detail. Thus, magnetic sensor 200 includes a differential Hall sensor pair 20, a current rail 21, and a readout circuit 22.

The readout circuit 22 includes an analog signal path that includes a voltage-to-current converter 23, an operational amplifier (opamp) 24 that includes a programmable current divider 25 and a compensation capacitor Cfb 26 that are provided in negative feedback paths, an external capacitive load CL 27, and an analog output 28.

In addition, the readout circuit 22 includes an auxiliary signal path implemented in the digital discrete time domain that provides digital assistance to the analog signal path. The auxiliary signal path includes a multiplexer 30, an ADC 31, a 1/x ADC 32, and a digital signal processor (DSP) 33 coupled to a memory 34.

The analog signal path is implemented in a continuous time domain such that a continuous real-time output signal ΔVout is generated based on the continuous real-time input signal ΔVin generated by the differential Hall sensor pair 20. The auxiliary signal path including temperature calibration, mechanical stress calibration, and supply voltage VDD calibration is implemented in digital discrete time domain in order assist in adjusting the analog gain realized at the analog output 28.

In particular, the differential Hall sensor pair 20 produce an analog differential input voltage ΔVin, which is received by the voltage-to-current converter 23. The voltage-to-current converter 23, using a sense resistor Rs, converts the differential input voltage ΔVin into a single ended current signal Igm. The current Igm is information representative of the measured magnetic field, as is the differential input voltage ΔVin. The V-I conversion is performed to avoid resistive loading to already low ohmic Hall sensor element and to improve the common mode rejection ratio where the common mode variation of the differential Hall sensor pair 20 is removed by the V-I conversion.

Alternatively, a differential voltage signal may be derived from two Hall sensors with two voltage-to-current converters.

The differential current is again converted back to an analog output voltage (i.e., differential output voltage ΔVout) using the programmable current divider 25 coupled to a negative feedback path of opamp 24. It is noted that, while the programmable current divider 25 is provided in a negative feedback path of the opamp 24, this negative feedback path serves as part of the total analog forward path of the circuit.

The opamp 24 is an inverting amplifier that is used to drive an external high capacitive load CL 27 of, for example, 6 nF. The programmable current divider 25 is placed in the negative feedback path of the opamp 24. Here, it is noted that a non-inverting input node VREF of opamp 24 is connected to a reference voltage, and is not limited to a particular voltage value. The inverting input node VINN of opamp 24 is at a virtual ground so that VREF and VINN are at the same potential. That is, VINN is maintained at a steady reference potential (i.e., VREF), without being connected directly to the reference potential. As a result, the differential input voltage of the opamp 24 (i.e., the difference between the potential at the non-inverting input and the inverting input of the op amp 24) is zero. As used herein, it will be appreciated that VREF and VINN may refer to the respective node or to the potential (voltage) at the respective node.

The single ended current signal Igm is received at VINN where it is fed into the programmable current divider 25 via the negative feedback path of the opamp 24. The programmable current divider 25 is an inverted R2R DAC that is a programmable resistor network that operates as a string of current dividers, whose output accuracy is dependent on how well each resistor is matched to the others. The programmable resistor network, as a whole, may be equivalent to an effective feedback resistor Rfb that has an effective resistive value that changes according to a programmed configuration of the resistor network.

Using the value of the effective feedback resistor Rfb, the inverted R2R DAC is configured to convert the differential current signal Igm into a gained feedback voltage Vfb. In particular, each current divider or tap of the inverted R2R DAC may be enabled to receive or disabled to not receive a portion of current Igm based on a programming code (e.g., a DAC code) programmed by a digital controller at the programmable current divider 25. A weighted current portion (e.g., Iw, 2Iw, 4Iw, etc.) of the differential current signal Igm flows through each enabled tap of the inverted R2R DAC according to the current division function of the inverted R2R DAC. The sum of all divided currents equals Igm. All currents are directed through a fixed resistor arrangement Rfixed that is connected in series to the programmable portion of the inverted R2R DAC, between the programmable portion and the output of the inverted R2R DAC, and induces a voltage drop to arrive at the feedback voltage Vfb.

The currents that arrive at the fixed resistor arrangement Rfixed include all weighted currents Iw (i.e., a total weighted current Iwt) plus a remaining current Ir. The remaining current Ir is the portion of Igm that flows through the default branch (i.e., through the resistor 8R) of the fixed resistor arrangement Rfixed. Thus, all currents in the resistor network are summed together at the output of the inverted R2R DAC to produce a cumulative feedback current Ifb that is converted into a feedback voltage Vfb via a voltage drop across Rout (see FIG. 3). More generally, Vfb is the product of Rfb and Igm. The feedback voltage Vfb is then added to the voltage at VREF by the opamp 24 to derive the single ended output voltage ΔVout at the analog output 28. Thus, the current Igm is converted into a gained voltage Vfb, which is a component of the single ended output voltage ΔVout and which contributes to the overall analog gain of ΔVout/ΔVin.

Based on this current-to-voltage conversion performed by the programmable current divider 25, voltage ΔVin is amplified according to the analog gain of the readout circuit 22. The total analog gain of the readout circuit 22 is determined by the value of the effective feedback resistor Rfb and the sense resistor Rs. Additional details of the programmable current divider 25 are provided in conjunction with FIG. 3.

The gain compensation due to temperature, mechanical stress, supply voltage VDD, and process variation is done using a digital assisted system provided in the auxiliary signal path. For example, measured parameters of temperature and mechanical stress may be received from a temperature sensor and a stress sensor, respectively. The temperature and stress values are converted from analog to digital values through a multiplexer 30 and an ADC 31, and are provided to the DSP 33 for further processing to program the programmable current divider 25.

In addition, supply voltage VDD ratiometricity may be implemented using a 1/x ADC function provided by the 1/x ADC 32. In particular, the 1/x ADC 32 may receive the supply voltage VDD and convert this parameter into a digital value using a 1/x ADC function. When the supply voltage VDD decreases, a 1/x ADC code generated by the by the 1/x ADC 32 decreases based on the received supply voltage VDD. The 1/x ADC 32 may provide the 1/x ADC code directly to the programmable current divider 25 or via a pass-through circuit of the DSP 33. This may decrease the analog gain ratiometrically. Thus, the 1/x conversion function may simplify the processing for the VDD input at the DSP 33. Accordingly, the 1/x converted VDD value may be then used by the DSP 33 for further processing to program the programmable current divider 25.

According to the auxiliary signal path, the output of each measurement parameter (e.g., temperature, mechanical stress, and supply voltage VDD) is converted into a digital value that is provided to the DSP 33 (i.e., the digital controller) that is configured to calculate an N-bit code word (i.e., a DAC code) from the digital values of temperature, mechanical stress, and supply voltage VDD. Once the N-bit code word is calculated, it may be output to the programmable current divider 25. For example, the DSP 33 may sample the digital values at sample times, and update the N-bit code word based on the sampled digital values. Upon updating the N-bit code word, the DSP 33 may update the programming of the programmable current divider 25.

In an example described herein, the DAC code may be an 11-bit code word that is derived from the digital values of temperature, mechanical stress, and supply voltage VDD. The DSP 33 provides the DAC code to the programmable current divider 25, which, in turn, is an 11-bit inverted R2R DAC used to vary the analog gain of the differential measurement signal based on the received DAC code.

The DSP 33 is a digital controller configured to control the programmable current divider 25 to thereby control the current gain in the negative feedback path of the opamp 24. By altering the current gain in the negative feedback path of the programmable current divider 25, the voltage at the output of the opamp 24 is also changed. By doing so, the differential measurement signal may be compensated for variations in temperature, mechanical stress, and supply voltage VDD.

The DSP 33 may use one or more of the measured parameters (e.g., temperature, mechanical stress, and supply voltage VDD) to perform a calculation or a conversion to derive an N-bit code word used to program the programmable current divider 25. The calculation or the conversion may be stored in the form of higher order polynomials, look up table, or a digital function stored in memory block 34. For example, gain and offset polynomial coefficients may be stored in an electrically erasable programmable read-only memory (EEPROM) which are accessible for programming the desired conversion formula(s) and the length of the N-bit code word.

Thus, these measured parameters are converted by the DSP 33 to an N-bit digital code value that represents the current state of temperature, mechanical stress, and/or supply voltage VDD. The N-bit digital code value is then used as a DAC code for programming the programmable current divider 25 (i.e., for adjusting the value of Rfb) for performing the analog signal compensation.

The compensation capacitor Cfb 26 is provided for the loop stability. This compensation capacitor Cfb 26 may be switchable, by receiving configuration information from the DSP 33, for a range of codewords which can control the bandwidth of the analog signal path and thereby reducing the noise bandwidth. The switch may be designed using the transmission gate which is controlled by one or more thermometer bits of the N-bit DAC code word (e.g., an 11-bit gain code word). The zero in the frequency response is decided by the Rfb and Cfb. Cfb may be adjusted to minimize the variation of Rfb*Cfb.

For a high accuracy requirement at high temperatures, an offset compensation loop can be implemented around the opamp 24. The variation between the virtual grounds of opamp 24 (VREF & VINN) may contribute to the accuracy error in the gain calibration. The Hall element has a sensitivity which decreases with the temperature. An analog gain which is on the higher side may be desired. Since, the Hall sensitivity to temperature is a 1/x function, the accuracy requirement increases at the high gain ranges. An offset compensation loop may be provided to make a difference with VREF and VINN as small as possible.

Turning to FIG. 3, additional details of the programmable current divider 25 are provided. In particular, FIG. 3 illustrates a schematic diagram of the programmable current divider 25.

As noted above, the programmable current divider 25 is an inverted R2R DAC placed in a negative feedback path of the opamp 24. Specifically, in this example, the programmable current divider 25 is an 11-bit inverted R2R DAC. However, it will be appreciated that the inverted R2R DAC may be configured with more or less bits depending on the application.

The inverted R2R DAC is an N-bit R-2R resistor ladder network that uses two resistor values (i.e., R and 2R) and a programmable current divider scheme that is adjusted based on an N-bit DAC code. Based on the N-bit DAC code, the value of the effective feedback resistor Rfb is changed and is used to regulate the voltage Vfb. For example, the inverted R2R DAC may be configured such that the value of the effective feedback resistor Rfb is inversely proportional to the N-bit DAC code by using, for example, a 1/x function. Thus, as the binary coded value of the N-bit DAC code increases the value of the effective feedback resistor Rfb decreases by, for example, a function of 1/x. Consequently, the current gain of the inverted R2R DAC is also inversely proportional to the binary coded value of the N-bit DAC based on the same function. It will be appreciated that different programming settings over temperature, mechanical stress, and supply voltage VDD may be used to compensate for these measurement parameters.

The programmable current divider 25 (i.e., the inverted R2R DAC) may include three portions that contribute to the value of the effective feedback resistor Rfb (or to the cumulative feedback current Ifb). The three portions include an n-bit binary portion 35 (e.g., 7-bit binary portion), an m-bit thermometer portion 36 (e.g., 4-bit thermometer portion), and a fixed resistor arrangement Rfixed, where the sum of n and m equal N, and N is 11. In addition to using more or less bits, it is also possible to implement the inverted R2R DAC without the n-bit binary portion 35 or the m-bit thermometer portion 36.

The inverted R2R DAC of the present example is realized using a 7-bit LSB binary DAC 35 and a 4-bit MSB thermometer DAC 36. The 7-bit binary DAC 35 is implemented using an R2R ladder where currents are binary weighted, increasing from D0 to D6. The thermometer DAC is realized using a parallel resistor bank where equal currents are flowing whose weights are equal to the D7 binary value (e.g., 128). This DAC arrangement may improve the monotonicity and may reduce glitches. The ratio between maximum and minimum gain can be configured using the fixed resistor arrangement Rfixed.

Figure 4:
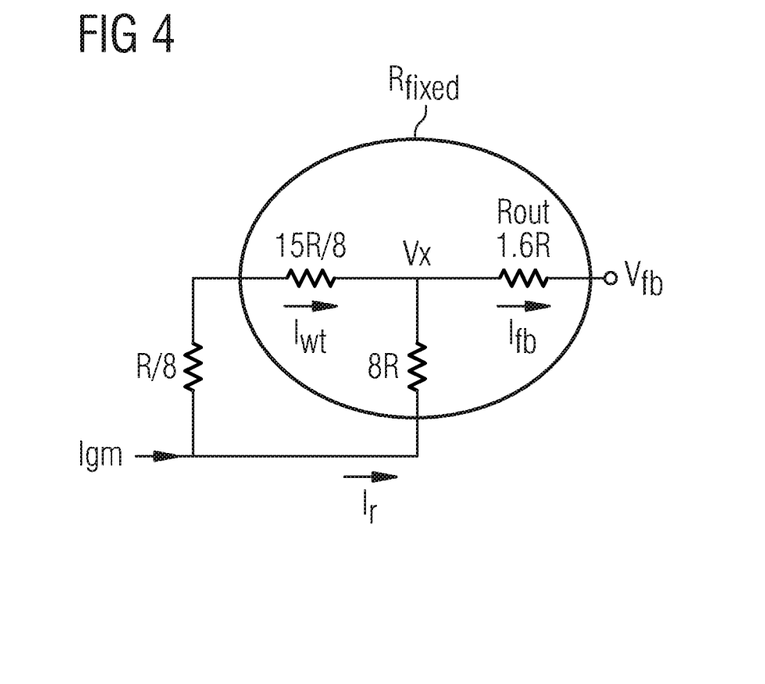

FIG. 4 illustrates a schematic diagram of an equivalent resistor ladder of the programmable current divider of FIG. 3 when all the bits are ON. That is, when the N-bit DAC codeword is, for example, 11111111111. Here, the total current Igm from the V-I converter 23 is flowing through the parallel combination of 2R of the DAC and the 8R resistor of the fixed resistor arrangement Rfixed, respectively. In this case, the feedback voltage Vfb can be calculated according to Equations (1) and (2).

$$Igm * 3.2R = Vfb \qquad \text{Eq. (1)}$$

$$\frac{Vfb}{Igm} = 3.2R \qquad \text{Eq. (2)}$$

Figure 5:
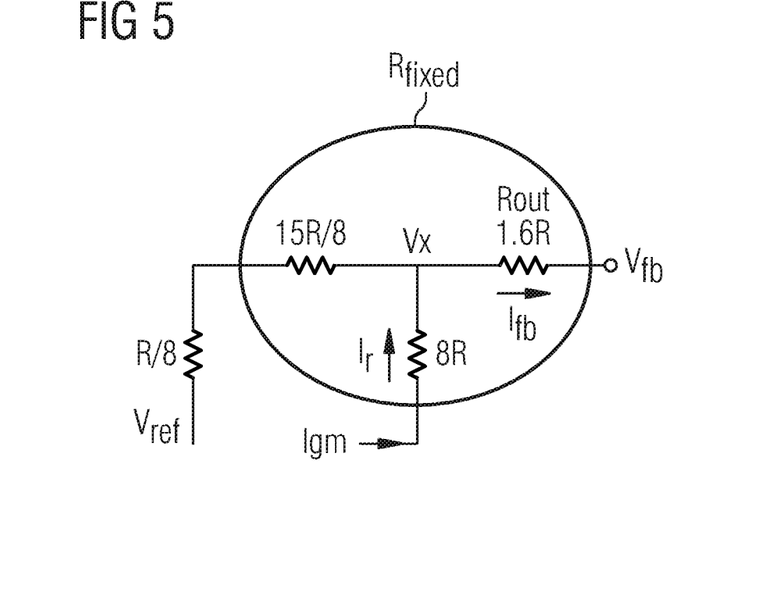
FIG. 5 illustrates a schematic diagram of an equivalent resistor ladder of the programmable current divider of FIG. 3 when all the bits are OFF.

FIG. 5 illustrates a schematic diagram of an equivalent resistor ladder of the programmable current divider of FIG. 3 when all the bits are OFF. That is, when the N-bit DAC codeword is, for example, 00000000000. Here, the total current Igm from the V-I converter 23 is flowing through the 8R resistor of the fixed resistor arrangement Rfixed. In this case, the feedback voltage Vfb can be calculated according to equations (3) and (4).

$$Igm * 8R = \frac{Vfb}{2} \qquad \text{Eq. (3)}$$

$$\frac{\mathit{Vfb}}{\mathit{Igm}} = 16R \qquad \text{Eq. (4)}$$

From Equations (2) and (4), it can be seen that the effective feedback resistor Rfb varies from 3.2R to 16R and is inversely proportional to N-bit DAC codeword.

The m-bit thermometer portion 36 corresponds to the most significant bits (MSBs) of the N-bit DAC code, while the n-bit binary portion 35 corresponds to the least significant bits (LSBs) of the N-bit DAC code. That means the current flowing in each tap of the m-bit thermometer portion 36 are more heavily weighted than the current that flows in each tap of the n-bit binary portion 35.

Furthermore, the splitting between the two different portions 35 and 36 depends on design parameters and may be adjusted. For example, the splitting may be configured based on an area of the inverted R2R DAC (i.e., how much die area can be allocated to the inverted R2R DAC) and on the desired linearity in performance of the inverted R2R DAC.

The inverted R2R DAC is a programmable resistor network that operates as a string of current dividers. Each current divider or tap carries a weighted portion of the input current Igm. The lowest weighted current may be referred to as Iw, and further weighted currents are binary weights of Iw (e.g., 2Iw, 4Iw, . . . 128Iw). Furthermore, a remaining portion Ir of the input current Igm flows through the last current tap (e.g., through resistor 8R), which is part of the fixed resistor arrangement Rfixed. Thus, in an 11-bit system, there are 12 total current taps, 11 of which are programmable. The total weighted current Iwt and the remaining current Ir are summed together to generate a cumulative feedback current Ifb, The higher the binary coded value of the DAC code, the higher the value for the total weighted current Iwt. The higher the value for the total weighted current Iwt, the lower the value of the effective feedback resistor Rfb. The lower the value of the effective feedback resistor Rfb, the lower the total analog gain of the circuit. On the other hand, the lower the binary coded value of the DAC code, the more current Ir that flows through last current tap (e.g., through resistor 8R of the default branch), and the higher the total analog gain of the circuit.

The n-bit binary portion 35, representing 7 bits in this example, is comprised of 7 current taps that are binary weighted with respect to each other such that the first tap closest to VINN is the least weighted (e.g., Iw) and the seventh tap furthest from VINN is the most weighted (e.g., 64Iw). Since the differential current signal Igm is input to the inverted R2R DAC at VINN, each successive tap of the n-bit binary portion 35 has an increased binary weight (i.e., $2^0, 2^1, 2^2, \ldots 2^6$) relative to a portion of the differential current signal Igm (i.e., Iw, 2Iw, 4Iw, 8Iw, 16Iw, 32Iw, and 64Iw).

Each tap of the n-bit binary portion 35 includes two switches (e.g., D0/D0b, D1/D1b, . . . , and D6/D6b). The first switch of each tap (D0, D1, . . . , and D6) is connected to VINN and the fixed resistor arrangement Rfixed. The second switch of each tap (D0b, D1b, . . . , and D6b) is connected to VREF. The first switch and the second switch of each tap operate in binary opposing states such that when one switch is closed (enabled by a logic 1 of the N-bit DAC code), the other switch is open (disabled by a logic 0 of the N-bit DAC code). Thus, each bit of the binary N-bit DAC code word connects a corresponding switch to either VREF or VINN.

Here, when the first switch of a tap (D0, D1, . . . , and D6) is closed, the current from VINN flows through the 2R resistor of that tap as a weighted current, which is then directed towards the output Vfb where the "enabled" currents are summed together to generate the cumulative feedback current Ifb. On the other hand, when the first switch of a tap (D0, D1, . . . , and D6) is open (i.e., when the second switch is closed), a current does not flow through that tap. Thus, when a tap is not "enabled", it does not contribute a current to the total weighted current Iwt, and, hence that tap does not contribute to the cumulative feedback current Ifb.

The m-bit thermometer portion 36, representing 4 bits in this example, is comprised of ($2^m-1$) current taps that are equally weighted with respect to each other, but are twice or double weighted than the highest bit of the n-bit binary portion 35. In fact, the current taps of the m-bit binary portion 36 are all equal to the next binary weight in the sequence following binary weight sequence of the n-bit binary portion 35. Since the n-bit binary portion 35 has 7 binary weighted currents (i.e., $2^0, 2^1, 2^2, \ldots 2^6$), the next binary weight in the sequence is $2^7$ (i.e., 128). Thus, each tap in the m-bit thermometer portion 36 contributes a current equal to 128Iw to total weighted current Iwt, and hence to the cumulative feedback current Ifb when the tap is "enabled."

The tap of the m-bit thermometer portion 36 closest to the fixed resistor arrangement Rfixed (i.e., furthest from VINN) corresponds to the MSB of the m-bit thermometer portion 36. On the other hand, the tap of the m-bit thermometer portion 36 furthest from the fixed resistor arrangement Rfixed (i.e., closest to VINN) corresponds to the LSB of the m-bit thermometer portion 36. When the 8th bit of the N-bit DAC code word is ON, first tap T1 of the m-bit thermometer portion 36 is connected. When only the $9^{th}$ bit of the N-bit DAC code word is ON, taps T1 and T2 of the m-bit thermometer portion 36 are ON. When both the 8th and the $9^{th}$ bits of the N-bit DAC code word are ON, taps T1, T2, and T3 of the m-bit thermometer portion 36 are activated. When only the 11th bit of the N-bit DAC code word is ON, taps T1 to T8 of the m-bit thermometer portion 36 are ON. When bits 8-11 of the N-bit DAC code word are ON, taps T1 to T15 of the m-bit thermometer portion 36 are ON. The other taps and combinations thereof are also activated by one of the possible remaining combinations of bits of the N-bit DAC code word.

The tap of the n-bit binary portion 35 closest to VINN corresponds to the LSB (e.g., the $1^{st}$ bit) of the N-bit DAC code word. Thus, bits 1-7 of the N-bit DAC code word respectively correspond to taps D0-D6 of the n-bit binary portion 35.

Similar to the n-bit binary portion 35, each tap of the m-bit thermometer portion 36 includes two switches (e.g., T0/T0b, T1/T1b, . . . , and T15/T15b). The first switch of each tap (T0, T1, . . . , and T15) is connected to VINN and the fixed resistor arrangement Rfixed. The second switch of each tap (T0b, T1b, . . . , and T15b) is connected to VREF. The first switch and the second switch of each tap operate in binary opposing states such that when one switch is closed (enabled by a logic 1 of the N-bit DAC code), the other switch is open (disabled by a logic 0 of the N-bit DAC code). Thus, each bit of the binary N-bit word connects a corresponding switch to either VREF or VINN.

Here, when the first switch of a tap (T0, T1, . . . , and T15) is closed, the current from VINN flows through the 2R resistor of that tap as a weighted current, which is then directed towards the output Vfb where the "enabled" currents are summed together to generate the total weighted current Iwt. On the other hand, when the first switch of a tap (T0, T1, . . . , and T15) is open (i.e., when the second switch is closed), a current does not flow through that tap. Thus, when a tap is not "enabled", it does not contribute a current to the total weighted current Iwt.

As noted above, each tap of the inverted R2R DAC has two binary opposing switches. This configuration may be used to avoid any change in potential in VREF and VINN such that VREF and VINN are maintained to be equal to each other. As a result, as each tap is switched from one switch to the other (i.e., between enabled and disabled states), the potential across each 2R resistor does not change.

In addition, the switches D0 to T15b are also binary weighted respective to the current weight of the respective tap. That is, the effective resistance (e.g., on resistance) of each switch is binary weighted in order to ensure an equal voltage drop across all switches. For example, in a tap that carries a larger current weight (e.g., an MSB tap), the effective resistance of the switches in that tap (e.g., T15 and T15b) is lower than the effective resistance of switches that are provided in a lower weighted branch (e.g., D0 and D0b) such the voltage drops among all branches are equal. This ensures that the current Igm splits across each branch according to the current division function of the inverted R2R DAC.

By using two binary weighted switches in each tap, it can be ensured that the current Igm splits across each tap according to the current division function of the inverted R2R DAC. Thus, the inverted R2R DAC works on the principle of summing currents, and the cumulative feedback current Ifb changes based on which current taps are enabled such that their respective weighted currents are summed together.

As can be seen, the N-bit DAC code influences the analog path by changing the value of the effective feedback resistor Rfb. Specifically, value of the effective feedback resistor Rfb is inversely proportional to the N-bit DAC code. In order to convert the current Igm into voltage Vfb, the current Igm is multiplied by the value of the effective feedback resistor Rfb to provide a voltage across the negative feedback path, which is added to VREF to derive the output voltage ΔVout. Since current Igm is fed through the negative feedback path that contains the programmable current divider 25, a decrease in the value of the effective feedback resistor Rfb due to a higher DAC code would result in a decrease in voltage Vfb at the output of the opamp 24. Consequently, a lower analog gain would be realized. Conversely, an increase in the value of the effective feedback resistor Rfb due to a lower DAC code would result in an increase in the voltage value at the output of the op amp 24. Consequently, a higher analog gain would be realized.

All currents are directed through a fixed resistor arrangement Rfixed that is connected in series to the programmable portion of the inverted R2R DAC, between the programmable portion and the output of the inverted R2R DAC, and induces a final voltage drop at the output resistor Rout to arrive at the feedback voltage Vfb. The ratio between maximum and minimum gain can be configured using the fixed resistor arrangement Rfixed. That is, if all taps of the inverted R2R DAC are disabled, current Igm would flow directly to the fixed resistor arrangement Rfixed as current Ir. This case would correspond to a maximum voltage gain that is defined, in part, by the resistor values of the resistors that make up the fixed resistor arrangement Rfixed. Alternatively, when all taps of the inverted R2R DAC are enabled, the total weighted current is a maximum. fixed resistor arrangement Rfixed. This case would correspond to minimum voltage gain that is defined, in part, by the resistor values of the resistors that make up the fixed resistor arrangement Rfixed.

This technique may consume less die area and power. The total analog forward path gain is determined by the ratio of the effective feedback resistor Rfb and the sense resistor Rs. Both the resistors are designed having the same temperature coefficient and the same process variation.

Using the resistors that make up the fixed resistor arrangement Rfixed in FIG. 3, the total analog forward path gain provided by the readout circuit 22 is set forth in equations (5), (6), and (7).

The detailed gain calculation:

$$Igm = \Delta Vin/Rs \qquad \text{Eq. (5)}$$

$$\text{Total Gain} = \frac{\Delta V_{out}}{\Delta V_{in}} = \frac{2R}{R_s} * \left(\frac{4096}{\text{Code} + 512}\right) \qquad \text{Eq. (6)}$$

$$\text{Total Gain} = \frac{\Delta V_{out}}{\Delta V_{in}} = \frac{2R}{R_s} * \left( \begin{array}{c} \frac{1}{\frac{D_0}{2^{12}} + \frac{D_1}{2^{11}} + \frac{D_2}{2^{10}} + \frac{D_3}{2^9} + \frac{D_4}{2^8} +} \\ \frac{D_5}{2^7} + \frac{D_6}{2^6} + \frac{T_1}{2^5} + \frac{T_2}{2^5} \ldots \ldots \ldots + \\ \frac{T_{14}}{2^5} + \frac{T_{15}}{2^5} + \frac{1}{8} \end{array} \right) \qquad \text{Eq. (7)}$$

In Equation (6), Code is the binary coded value of the N-bit DAC code. In Equation (7), T1-T15 correspond to the 7-bit thermometer portion 36, and each of T1-T15 may be either a 0 or a 1 based on the corresponding bit value of the N-bit DAC code. Similarly, D0-D6 correspond to the 4-bit binary portion 35, and each of D0-D6 may be either a 0 or a 1 based on the corresponding bit value of the N-bit DAC code. Thus, if the corresponding bit of the N-bit DAC code is a 1, the corresponding tap contributes a weighted current value according to Equation (7). If the corresponding bit of the N-bit DAC code is a 0, the corresponding tap does not contribute a weighted current value according to Equation (7). The value ⅛ in Equation (7) is representative of the last current tap formed by the fixed resistor arrangement Rfixed.

Based on Equation (7), the effective feedback resistor is inversely proportional to the DAC code. That is, the total analog gain increases as the binary coded value of the DAC code decreases, and vice versa.

In view of the above embodiments, an inverted R2R DAC may be used in the negative feedback path of inverting amplifier that is implemented in conjunction with digitally assisted analog gain compensation to compensate for the non-linear sensitivity of one or more Hall sensors over temperature and mechanical stress. Other compensation parameters, such as supply voltage VDD and the process corners may also be used in the digitally assisted analog gain compensation.

In addition, since the inverted R2R DAC makes use of resistor matching for the gain, low power may be used. This technique may also be useful for mid-high bandwidth of operations from 0 to 120 kHz, and, more particularly, from 10 to 120 kHz. A phase delay between input to output may also be reduced with less number of cascaded stages.

While various embodiments have been described, it will be apparent to those of ordinary skill in the art that many more embodiments and implementations are possible within the scope of the invention. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A magnetic sensor comprising:
    at least one magnetic field sensor element configured to generate an analog input sensor signal in response to a magnetic field;
    an inverting amplifier configured to generate an analog output sensor signal having a gained value with respect to the analog input sensor signal;
    a programmable current divider disposed in a negative feedback path of the inverting amplifier, wherein the gained value is dependent on an effective feedback resistor value of the programmable current divider; and
    a digital controller configured to receive at least one measurement parameter, generate a codeword based on the at least one measurement parameter, and transmit the codeword to the programmable current divider for compensating the gained value,
    wherein the effective feedback resistor value is adjusted based on the codeword received by the programmable current divider.

2. The magnetic sensor of claim 1, wherein the at least one magnetic field sensor element includes a differential Hall sensor element pair, the analog input sensor signal is a first differential Hall voltage, and the analog output sensor signal is a second differential Hall voltage.

3. The magnetic sensor of claim 1, further comprising:
    at least one voltage-to-current converter configured to convert the analog input sensor signal into an analog current signal, and output the analog current signal into the programmable current divider via the negative feedback path.

4. The magnetic sensor of claim 3, wherein the voltage-to-current converter includes a sense resistor configured to convert the analog input sensor signal into the analog current signal, wherein the gained value corresponds to a ratio of the effective feedback resistor value and a resistor value of the sense resistor.

5. The magnetic sensor of claim 1, wherein:
    the inverting amplifier, the programmable current divider, and the voltage-to-current converter operate in a continuous time domain, and
    the digital controller operates in a digital discrete time domain such that the at least one measurement parameter is sampled and the codeword updated at a plurality of sample times.

6. The magnetic sensor of claim 1, wherein the effective feedback resistor value is inversely proportional to a binary coded value of the codeword according to an inverse function.

7. The magnetic sensor of claim 6, wherein the inverse function is 1/x.

8. The magnetic sensor of claim 1, wherein the programmable current divider is an R2R digital-to-analog converter (DAC).

9. The magnetic sensor of claim 8, wherein the codeword is an N-bit codeword, and the R2R DAC comprises:
    an n-bit binary portion comprising a first set of binary weighted current taps;
    an m-bit thermometer portion comprising a second set of equal weighted current taps; and
    a fixed resistor arrangement configured to receive currents enabled by the N-bit codeword and generate an effective feedback voltage from which the gained value is derived,
    where N is the sum of n and m.

10. The magnetic sensor of claim 9, wherein the second set of equal weighted current taps have a binary weight greater than the first set of binary weighted current taps.

11. The magnetic sensor of claim 9, wherein the fixed resistor arrangement defines a ratio between a maximum and a minimum of the gained value.

12. The magnetic sensor of claim 1, wherein the at least one measurement parameter includes a temperature value, a mechanical stress value, or a voltage supply VDD value.

13. The magnetic sensor of claim 1, wherein the analog output sensor signal is independent from the at least one measurement parameter.

14. The magnetic sensor of claim 1, wherein the programmable current divider is configured to receive the codeword from the digital controller and adjust the effective feedback resistor value based on the received codeword.

15. The magnetic sensor of claim 1, wherein the digital controller is configured to receive the at least one measurement parameter from measurement circuitry.

16. A method for gain compensation implemented in a magnetic sensor, the method comprising:
    generating an analog input sensor signal by at least one magnetic field sensor element in response to a magnetic field;
    generating an analog output sensor signal based on the analog input sensor signal, the analog output sensor signal having a gained value with respect to the analog input sensor signal;
    generating a codeword based on at least one digital measurement parameter; and adjusting an effective feedback resistor value of a negative feedback path of an inverting amplifier based on the codeword such that the gained value is adjusted to compensate for the at least one digital measurement parameter.

17. The method of claim 16, further comprising:

converting the analog input sensor signal into an analog current signal;

transmitting the analog current signal to the negative feedback path; and converting the analog current signal into the analog output sensor signal based on the codeword.

18. The method of claim 16, wherein the effective feedback resistor value is inversely proportional to a binary coded value of the codeword according to an inverse function.

19. The method of claim 18, wherein the inverse function is 1/x.

20. The method of claim 16, wherein the at least one measurement parameter includes a temperature value, a mechanical stress value, or a voltage supply VDD value.

21. The method of claim 16, wherein generating the codeword includes generating the codeword based on the at least one digital measurement parameter such that the analog output sensor signal is independent from the at least one measurement parameter.

22. The method of claim 16, wherein the effective feedback resistor value is an effective resistor value of an R2R digital-to-analog converter (DAC) and the at least one magnetic field sensor includes at least one Hall sensor element.

* * * * *